US010439599B2

(12) United States Patent
Nikonov et al.

(10) Patent No.: US 10,439,599 B2
(45) Date of Patent: Oct. 8, 2019

(54) NON-BOOLEAN ASSOCIATIVE PROCESSOR DEGREE OF MATCH AND WINNER TAKE ALL CIRCUITS

(71) Applicant: Intel Corporation, Santa Clara, CA (US)

(72) Inventors: Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 843 days.

(21) Appl. No.: 14/864,241

(22) Filed: Sep. 24, 2015

(65) Prior Publication Data

US 2017/0093377 A1     Mar. 30, 2017

(51) Int. Cl.
H03K 3/03       (2006.01)
G06K 9/00       (2006.01)

(52) U.S. Cl.
CPC ......... H03K 3/0315 (2013.01); G06K 9/0055 (2013.01)

(58) Field of Classification Search
CPC ............................ H03K 3/0315; G06K 9/0055
See application file for complete search history.

(56) References Cited

U.S. PATENT DOCUMENTS

| | | | | |
|---|---|---|---|---|
| 5,376,840 | A * | 12/1994 | Nakayama | ................ G05F 1/46 327/537 |
| 6,683,504 | B1 * | 1/2004 | Abernathy | ............... H03B 5/02 327/158 |
| 6,788,577 | B2 | 9/2004 | Mihara | |
| 7,349,279 | B2 | 3/2008 | Tsern et al. | |
| 7,433,249 | B2 | 10/2008 | Jung | |
| 7,484,035 | B2 | 1/2009 | Yamaguchi | |
| 7,813,216 | B2 | 10/2010 | Wuidart | |
| 8,897,047 | B2 | 11/2014 | Bourianoff et al. | |
| 2003/0202299 | A1 | 10/2003 | Maloney et al. | |

(Continued)

FOREIGN PATENT DOCUMENTS

EP           1118954 A4        7/2001

OTHER PUBLICATIONS

Shibata, et al., "CMOS supporting circuitries for nano-oscillator-based associative memories", 13th International Workshop on Cellular Nanoscale Networks and Their Applications (CNNA) (2012), 5 pages.

(Continued)

*Primary Examiner* — Jeffrey M Shin
(74) *Attorney, Agent, or Firm* — Schwabe, Williamson & Wyatt, P.C.

(57) ABSTRACT

Embodiments include circuits, apparatuses, and systems for non-boolean associative processors. In embodiments, an electronic associative processor circuit may include first and second ring oscillators, each having an odd number of inverters, an input terminal, and an output terminal. A first capacitor may have a first terminal coupled with the output terminal of the first ring oscillator and a second capacitor may have a first terminal coupled with the output terminal of the second ring oscillator. Second terminals of the first and second capacitors may be coupled at an oscillator stage output terminal. The inverters of the first and second ring oscillators may be implemented with metal oxide semiconductor transistors. Other embodiments may be described and claimed.

25 Claims, 6 Drawing Sheets

(56) References Cited

U.S. PATENT DOCUMENTS

| 2005/0071114 | A1 | 3/2005 | Nehrig | |
|---|---|---|---|---|
| 2012/0188811 | A1* | 7/2012 | Mattausch | G11C 15/04 365/49.17 |
| 2015/0145607 | A1 | 5/2015 | Caffee | |

OTHER PUBLICATIONS

Non-Final Office Action dated Feb. 25, 2014 for U.S. Appl. No. 13/629,935, 15 pages.
Itoh, et al., Star Cellular Neural Networks for Associative and Dynamic Memories, International Journal of Bifurcation and Chaos, 2004, 1725-1772, vol. 14, No. 5, World Scientic Publishing Company.
Hoppensteadt, et al., Canonical Neural Models, The MIT press, 2001, pp. 1-7, Cambridge, MA.
Hoppensteadt, et al., Pattern Recognition via Synchronization in Phase-Locked Loop Neural Networks, IEEE Transactions on Neural Networks, May 2000, 734-738, vol. 11, No. 3.
Corinto, et al., Weakly Connected Oscillatory Network Models for Associative and Dynamic Memories, International Journal of Bifurcation and Chaos, 2007, 4365-4379, vol. 17, No. 12, World Scientific Publishing Company.
Hoppensteadt, et al., Oscillatory Neurocomputers with Dynamic Connectivity, Apr. 5, 1999, 2983-2986, vol. 82, No. 14, The American Physical Society.
Pufall, et al., Electrical Measurement of Spin-Wave Interactions of Proximate Spin Transfer Nanooscillators, Aug. 25, 2006, 4 pages.
International Search Report and Written Opinion dated Nov. 18, 2016 for International Application No. PCT/US2016/047069, 14 pages.
Shibata et al., "CMOS Supporting Circuitries for Nano-Oscillator-Based Associative Memories," Cellular Nanoscale Networks and Their Applications (CNNA), (2012), pp. 1-5.

* cited by examiner

NON-BOOLEAN ASSOCIATIVE PROCESSOR DEGREE OF MATCH AND WINNER TAKE ALL CIRCUITS

FIELD

Embodiments of the present invention relate generally to the technical field of electronic circuits, and more particularly to non-boolean associative processors.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Some computing tasks such as pattern matching and image recognition may be performed more efficiently using non-boolean associative processing approaches rather than standard digital processing techniques. However, current associative processor designs typically include components that make them impractical for fabrication.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
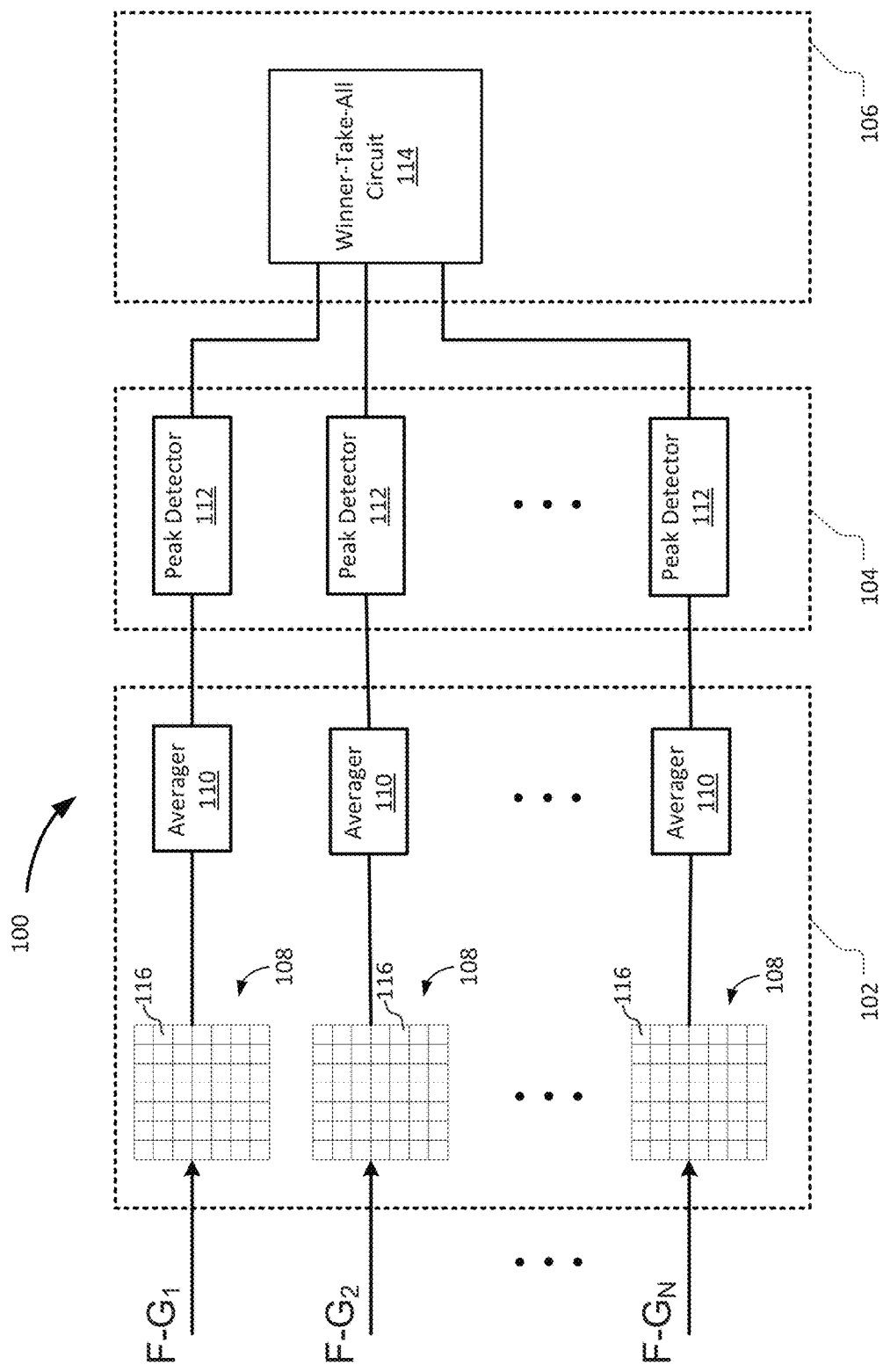
FIG. 1 schematically illustrates an associative processor, in accordance with various embodiments.

Embodiments of the present disclosure describe circuits, apparatuses, and systems for non-boolean associative processors. Metal oxide semiconductor (MOS) transistors may be used for various circuit stages of an associative processor such as a coupled oscillator stage, a degree-of-match or peak detector stage, and a winner-take-all stage. In embodiments, an electronic associative processor circuit may include first and second ring oscillators, each having an odd number of inverters, an input terminal, and an output terminal. A first capacitor may have a first terminal coupled with the output terminal of the first ring oscillator and a second capacitor may have a first terminal coupled with the output terminal of the second ring oscillator. Second terminals of the first and second capacitors may be coupled at an oscillator stage output terminal. The inverters of the first and second ring oscillators may be implemented with MOS transistors.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

FIG. 1 schematically illustrates an associative processor 100 in accordance with various embodiments. The associative processor 100 may include an oscillator stage 102, a peak detector stage 104, and a winner-take-all stage 106. In embodiments, the oscillator stage 102 may include a plurality of oscillator arrays 108, with each oscillator array 108 coupled with an averager 110. The peak detector stage 104 may include a plurality of peak detectors 112, with each peak detector 112 coupled with one of the averagers 110. In embodiments, the winner-take-all stage 106 may include a winner-take-all circuit 114 coupled with each of the peak detectors 112. The winner-take-all stage 106 may be a k-winner-take-all stage in various embodiments.

In various embodiments, the associative processor 100 may take any real-valued vectors as inputs. In some embodiments, each oscillator array 108 of the associative processor 100 may take an input corresponding to an image fragment, F, as a first input and a series of templates or filters as a second input. In embodiments, the second input may correspond to a series of Gabor filters, $G_1$ to $G_N$. In other embodiments, as shown, each oscillator array may take an input corresponding to a difference between an input value and a filter. In some embodiments, the difference between the input value and the filter may correspond to the difference between the image fragment, F, and one of a series of Gabor filters at a pixel in the image fragment.

Each oscillator array 108 may include a plurality of oscillators 116. In some embodiments, each oscillator 116 may correspond to a pixel. Each oscillator array 108 may include an array of oscillators 116 representing an array of pixels that may be a 7×7 array with 49 oscillators 116, as shown. A series of 24 Gabor filters may be used in some embodiments such that 24 arrays with 49 oscillators each may be used. Other array sizes and/or numbers of filters may be used in other embodiments. A match between a fragment, F, and a filter $G_n$ may be performed in each oscillator array 108. For a good match, oscillators 116 in the oscillator array 108 may synchronize. For a bad match, most oscillators 116 in the oscillator array 108 may remain un-synchronized.

In some embodiments, an envelope of voltage in each averager 110 may express a degree of oscillator synchronization that may also be referred to as a degree of match. Each peak detector 112 may take an output of an averager 110 as an input, and determine the degree of match. The winner-take-all circuit 114 may be a k-winner-take-all circuit that takes outputs of the peak detectors 112 as inputs, finds one or more best matches (e.g., "winners"), and samples and holds the winners once the winners are determined. In various embodiments, a bus of binary outputs from the peak detectors 112 may hold indices of the winners.

Figure 2:
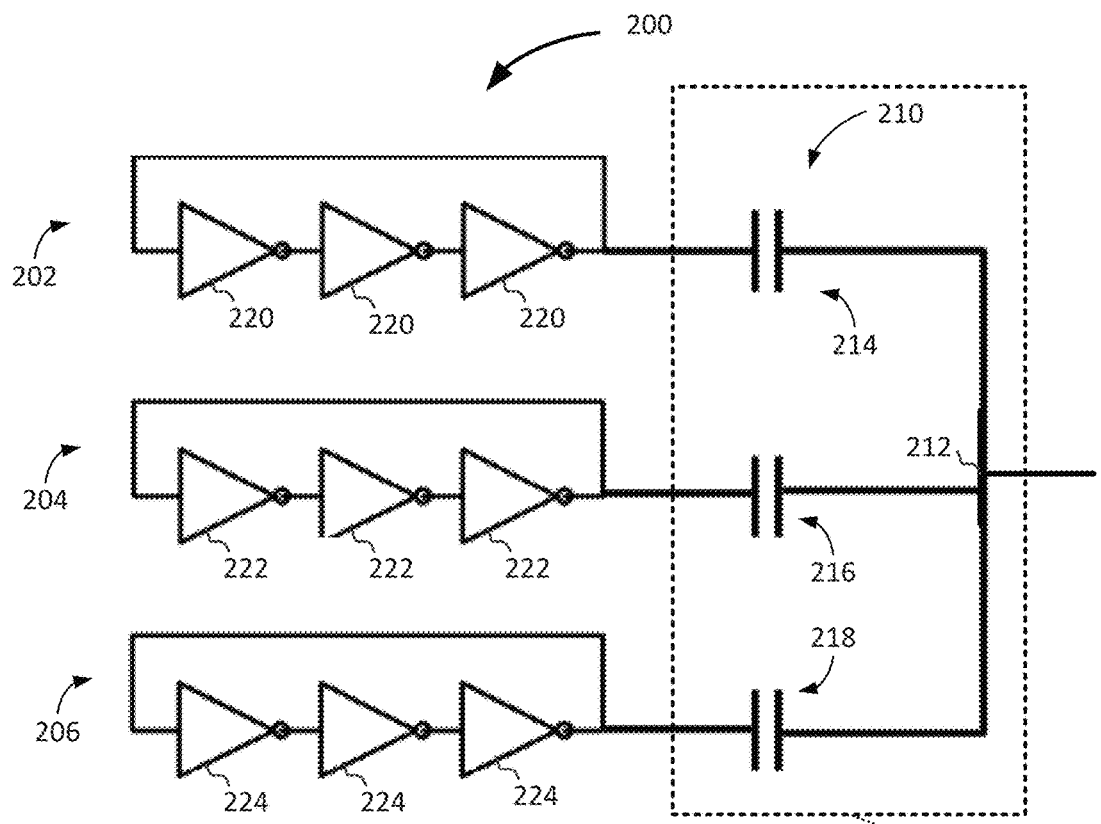
FIG. 2 schematically illustrates a coupled ring oscillator circuit that may be used in the associative processor of FIG. 1, in accordance with various embodiments.

FIG. 2 schematically illustrates a coupled ring oscillator circuit 200 that may be used in the associative processor 100 of FIG. 1 in accordance with various embodiments. As shown, the coupled ring oscillator circuit 200 may include a first ring oscillator 202, a second ring oscillator 204, and a third ring oscillator 206. In some embodiments, each of the ring oscillators may correspond to one of the oscillators 116 described with respect to FIG. 1. Only three oscillators are shown in FIG. 2 for clarity, but it should be understood that the coupled ring oscillator circuit 200 may include a different number of oscillators. In various embodiments, each of the ring oscillators may have an odd number of inverters and, as shown, may be a three stage ring oscillator with three inverters. In some embodiments, the ring oscillators may include a different number of inverters. The ring oscillators in the ring oscillator circuit 200 may have adjustable frequencies, and may be voltage controlled ring oscillators in some embodiments.

In various embodiments, the coupled ring oscillator circuit 200 may include an averager 208 that may correspond to one of the averagers 110 described with respect to FIG. 1. The averager 208 may include a plurality of capacitors 210, with the averager 208 taking an output from each ring oscillator as inputs, with each capacitor of the average 208 coupled with an output of one of the ring oscillators. The plurality of capacitors 210 may be coupled together at a common node 212 that forms an output terminal of the averager 208 in various embodiments. The plurality of capacitors 210 may include a first capacitor 214, a second capacitor 216, and a third capacitor 218. In embodiments, each of the plurality of capacitors 210 may be a coupling capacitor with a capacitance of approximately 1 femto Farad (fF). In various embodiments, the plurality capacitors 210 may be metal to metal finger capacitors or any other type of suitable capacitor. In some embodiments, one or more of the capacitors in the plurality of capacitors 210 may be implemented using a MOS transistor such that it functions as a capacitor in the coupled ring oscillator circuit 200.

The first ring oscillator 202 may include inverters 220, the second ring oscillator 204 may include inverters 222, and the third ring oscillator 206 may include inverters 224. A control voltage, $V_{ctrl}$, may be provided as a variable supply voltage to at least one of the inverters in each ring oscillator. The control voltage may correspond to a difference between an input and a filter, such as the difference between a pixel of an image fragment and a Gabor filter, in various embodiments. The control voltage may be determined in relation to a positive supply voltage, $V_{dd}$, such as $1.05V_{dd}$ for the first ring oscillator 202, $1V_{dd}$ for the second ring oscillator 204, and $0.95V_{dd}$ for the third ring oscillator 206 if those control voltages corresponded to the difference between the input and a filter. In some embodiments, the control voltage may be provided to all of the inverters in each ring oscillator.

Figure 3:
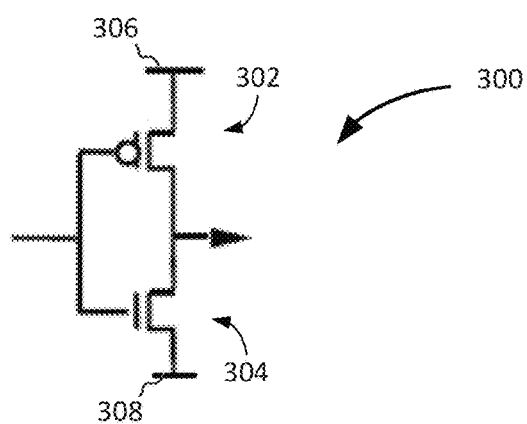
FIG. 3 schematically illustrates an inverter that may be used in the coupled ring oscillator circuit of FIG. 2, in accordance with various embodiments.

FIG. 3 schematically illustrates an inverter 300 that may be used in the coupled ring oscillator circuit 200 of FIG. 2, in accordance with various embodiments. In embodiments, the inverter 300 may include a first transistor 302 and a second transistor 304. In some embodiments, the first transistor 302 may be a P-type MOS transistor and the second transistor 304 may be an N-type MOS transistor. The gates of the first transistor 302 and the second transistor 304 may be coupled together, and the drains of the first transistor 302 and the second transistor 304 may be coupled together in various embodiments. In some embodiments, the inverter 300 may include a first variable supply voltage input terminal 306 at a source of the first transistor 302 to receive a first variable supply voltage input and a second input terminal 308 at a source of the second transistor 304. In some embodiments, the second input terminal 308 may be coupled with ground. Alternatively, in various embodiments, the second input terminal 308 may receive a second variable supply voltage input. In some embodiments where the second input terminal 308 is coupled with ground, the first variable supply voltage input terminal 306 may function as an input terminal for a ring oscillator such as the ring oscillator 202, the ring oscillator 204, or the ring oscillator 206.

In some embodiments where the second input terminal 308 is coupled with ground, the first input terminal 306 may receive a variable supply voltage input corresponding to a difference between an input such as a pixel of an image fragment and a filter, such as a portion of a Gabor filter. In embodiments where the second input terminal 308 receives a second variable supply voltage input, the first input terminal 306 may receive a first variable supply voltage input corresponding to an input such as a pixel of an image fragment, and the second input terminal 308 may receive a second variable supply voltage input corresponding to a portion of a filter such as a Gabor filter. In embodiments, this may allow differential control of the frequency of the ring oscillator based on the first variable supply voltage and the second variable supply voltage.

Figure 4:
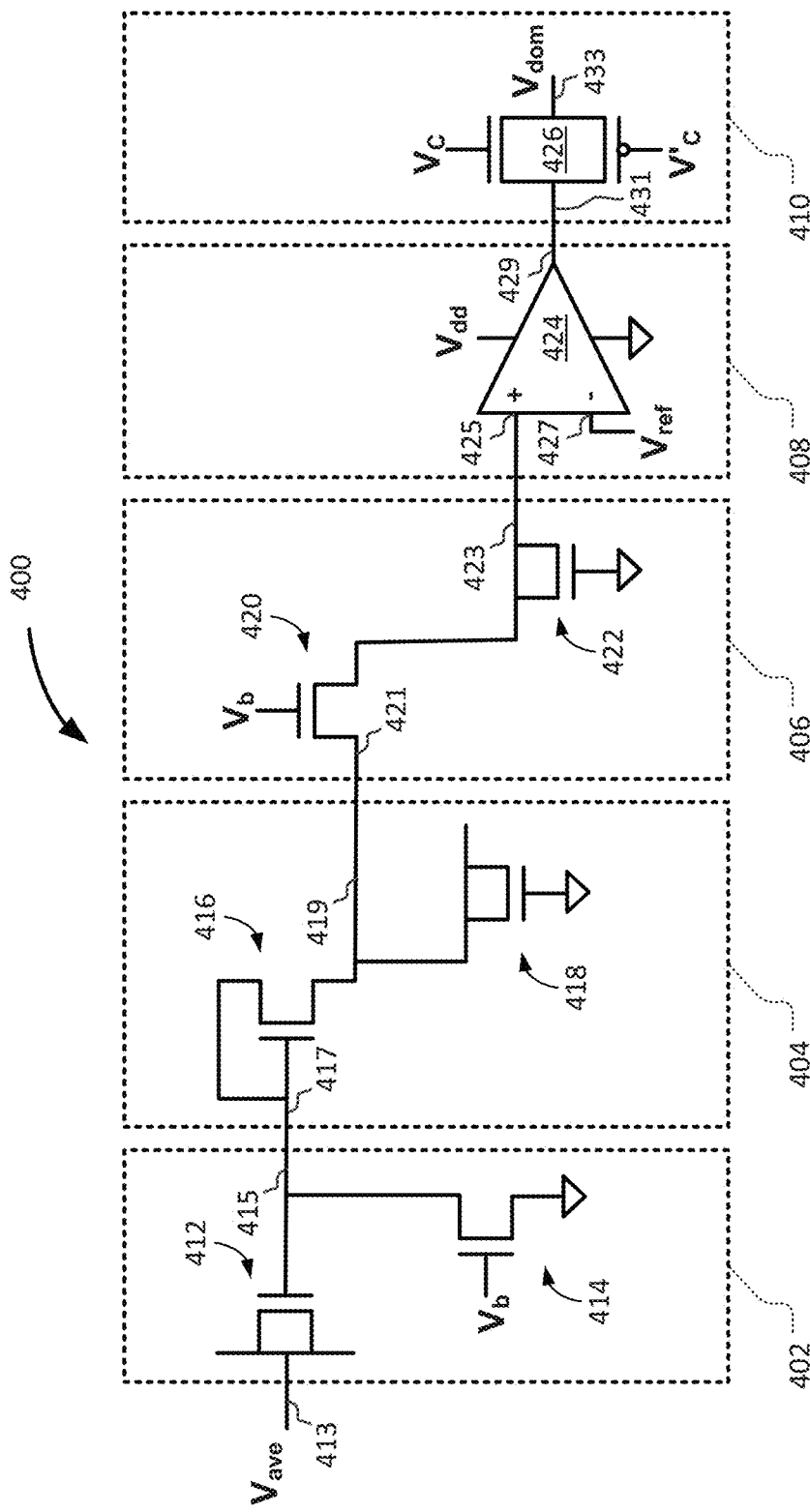
FIG. 4 schematically illustrates a peak detector that may be used in the associative processor of FIG. 1, in accordance with various embodiments.

FIG. 4 schematically illustrates a peak detector 400 that may be used in the associative processor 100 of FIG. 1, in accordance with various embodiments. A peak detector such as the peak detector 400 may correspond to one or more of the peak detectors 112, in some embodiments. The peak detector 400 may include a high-pass filter 402, a rectifier 404 coupled with the high-pass filter 402, a low-pass filter 406 coupled with the rectifier 404, an amplifier 408 coupled with the low-pass filter 406, and a cut-off trigger 410 coupled with the amplifier 408.

In some embodiments, the high-pass filter 402 may include a first transistor 412 connected to function as a capacitor, with the source and drain of the first transistor 412 coupled at a high-pass filter input terminal 413, that may function as an input terminal of the peak detector 400, to receive an output of an averager such as a signal from the averager 208 at the common node 212. The high-pass filter 402 may include a second transistor 414 having a drain coupled with a gate of the first transistor 412 at a high-pass filter output terminal 415. The second transistor 414 may receive a bias voltage $V_b$ at its gate, and the source of the second transistor 414 may be coupled with ground in various embodiments. The high-pass filter 402 may center waveforms received from an averager at or near zero in some embodiments. A characteristic frequency of the high pass filter 402 may be based at least in part on a capacitance of the first transistor 412 and a resistance of the second transistor 414 in various embodiments. In some embodiments, the second transistor 414 may be a transistor with 8 fins and the first transistor 412 may have a single fin. In various embodiments, the number of fins for transistors in the peak detector 400 may be selected to achieve desired capacitance, resistance, or other electrical characteristics. A greater number of fins may be correlated with decreased resistance in comparison to transistors with fewer fins some embodiments.

The rectifier 404 may include a third transistor 416 coupled in a diode-connected fashion to function as a diode, with a drain and gate of the third transistor 416 coupled at a rectifier input terminal 417 to receive an output of the high-pass filter 402. The rectifier 404 may include a fourth transistor 418 connected to function as a capacitor, with the source and drain of the fourth transistor 418 coupled with the source of the third transistor 416 at a rectifier output terminal 419. The gate of the fourth transistor 418 may be coupled with ground in various embodiments. The rectifier 404 may generate a positively valued waveform at the rectifier output terminal 419 based at least in part on a signal received from the high-pass filter 402 at the rectifier input terminal 417. The fourth transistor 418 may have 4 fins and the third transistor 416 may have a single fin in some embodiments.

The low-pass filter 406 may include a fifth transistor 420 with a low-pass filter input terminal 421 at a drain of the fifth transistor 420 to receive an output of the rectifier 402. A gate of the fifth transistor 420 may receive a bias voltage that sets a resistance of the fifth transistor 420. The low-pass filter 406 may include a sixth transistor 422 connected to function as a capacitor, with the source and drain of the sixth transistor 422 coupled with the drain of the fifth transistor 420 at a low pass filter output terminal 423. The gate of the sixth transistor 422 may be coupled with ground in various embodiments. The low-pass filter 406 may filter out ripple in some embodiments. A characteristic frequency of the low-pass filter 406 may be based at least in part on a resistance of the fifth transistor 420 and a capacitance of the sixth transistor 422. The fifth transistor 420 may have a single fin and the sixth transistor may have 4 fins in some embodiments. In various embodiments, one or more capacitors may be used instead of one or more of the transistors connected to function as capacitors. Metal to metal finger capacitors or any other type of suitable capacitors may be used to replace one or more of the first transistor 412, the fourth transistor 418, or the sixth transistor 422 in some embodiments.

The amplifier 408 may include an operational amplifier 424 to receive an output of the low-pass filter 406 at a non-inverting amplifier input terminal 425. An inverting amplifier input terminal 427 may be coupled with a reference voltage, $V_{ref}$, in various embodiments. The amplifier 408 may provide an amplified signal at an amplifier output terminal 429. The operational amplifier 424 may be coupled with a positive supply input voltage Vdd and ground in some embodiments. In various embodiments, the amplifier 408 may boost a signal such that the signal is at a level of at least Vdd/2 at the amplifier output terminal 429 for those signals determined to represent a degree of synchronization or match high enough to be a winner.

The cut-off trigger 410 may include a pass gate 426 to receive an output of the amplifier 408 at a cut-off trigger input terminal 431. The cut-off trigger 410 may include an output terminal 433 to provide a degree of match signal $V_{dom}$, in various embodiments. The pass gate 426 may receive cut-off signals $V_C$ and $V'_C$ to latch the pass gate 426 in some embodiments.

Figure 5:
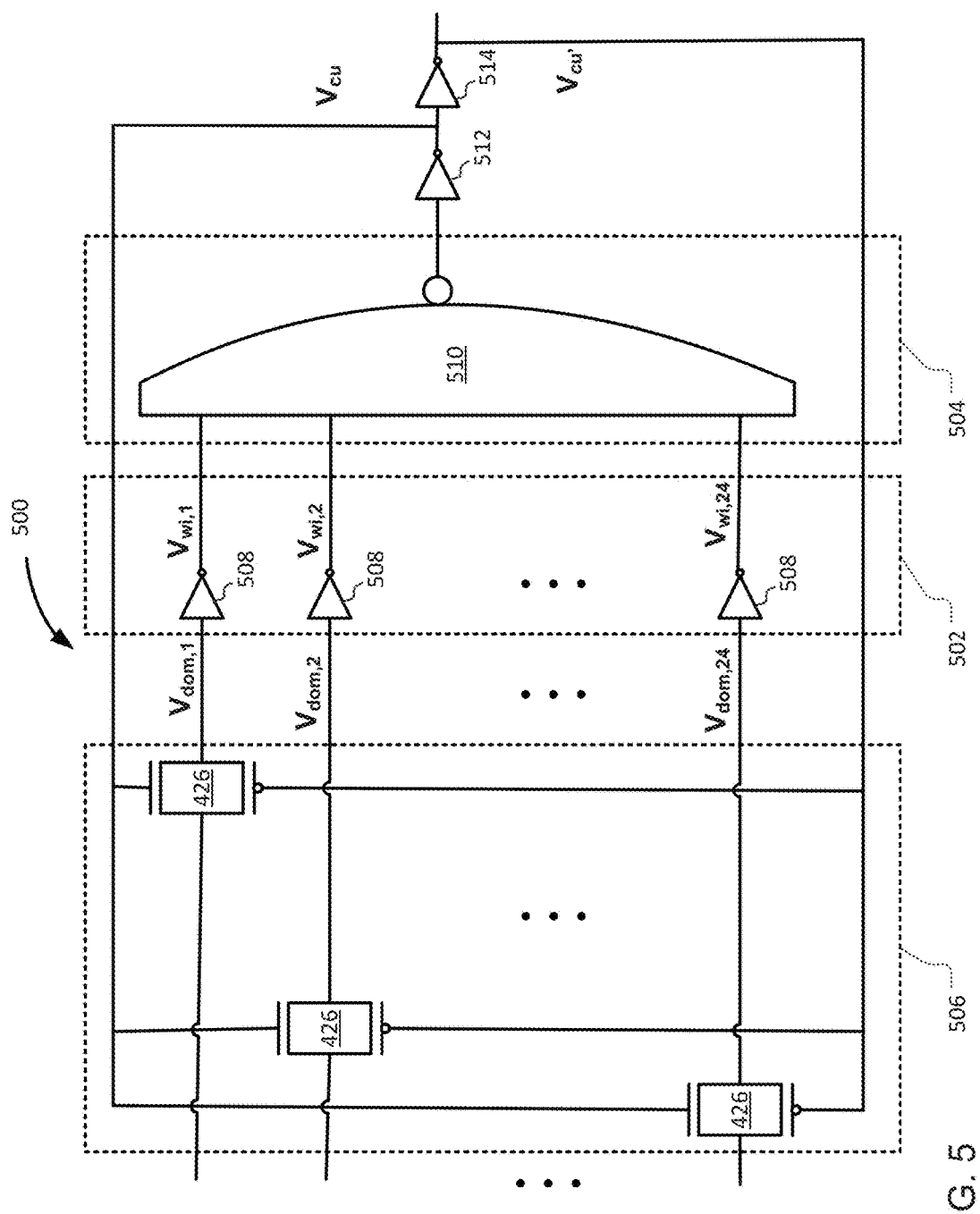
FIG. 5 schematically illustrates a winner-take-all circuit that may be used in the associative processor of FIG. 1, in accordance with various embodiments.

FIG. 5 schematically illustrates a winner-take-all circuit 500 that may be used in the associative processor 100 of FIG. 1, in accordance with various embodiments. The winner-take-all circuit 500 may include an inverter stage 502 coupled with a dynamic NAND stage 504. A cut-off trigger stage 506 is shown to illustrate how the winner take-all circuit 500 may be coupled with the cut-off trigger 410 of the peak detector 400 in some embodiments. The cut-off trigger stage 506 may include a plurality of pass-gates such as the pass-gate 426 that may receive an output from an amplifier such as the amplifier 408. Each of the pass-gates in the plurality of pass-gates may output a voltage indicating a degree of match, in various embodiments.

The inverter stage 502 may include a plurality of inverters 508 with inverter input terminals that receive the degree of match signals, $V_{dom}$, from the cut-off trigger stage 506. The inverters 508 may include output terminals that output binary winner flags, $V_{wi}$. The dynamic NAND stage 504 may include a NAND gate 510 that takes outputs of the inverters 508 as inputs at a plurality of input terminals and generates a NAND gate output at an NAND output terminal. The winner-take-all circuit 500 may further include a first NAND output inverter 512 that takes the NAND gate output as an input to provide a cut-off signal $V_{cu}$. A second NAND output inverter 514 may take the cut-off signal $V_{cu}$ as an input to provide an inverted cut-off signal $V_{cu'}$ as an output. The first NAND output inverter 512 may include transistors with 4 fins, and the second NAND output inverter 514 may include transistors with 16 fins in some embodiments.

The cut-off signal $V_{cu}$ may be fed back to the non-inverting inputs of the pass gates in the cut-off triggers of the peak detector and the inverted cut-off signal $V_{cu'}$ may be fed back to the inverting inputs of the pass gates in the cut-off triggers of the peak detector. In various embodiments, the cut-off signal $V_{cu}$ may correspond to the cut-off signal $V_C$ and the inverted cut-off signal $V_{cu'}$ may correspond to the cut-off signal $V'_C$ described with respect to FIG. 4. In some embodiments, outputs of peak detectors switch outputs of inverters 508 only if they are among winners. For the rest of the ring oscillator arrays, a growth of amplitude is halted by the cut-off trigger once winners are determined. As soon as any inverter 508 switches, so does the output of the NAND stage 504. This may constitute a determination of winners, with outputs available as the binary winner flags, $V_{wi}$.

In embodiments, when the cut-off signal and the inverted cut-off signal trigger the cut-off triggers, digital binary winner flags may be available at the outputs of the inverters 508 and may be provided on a bus in some embodiments. A readout circuit (not shown) may be used to read one or more winners. After the one or more winners are read, the associative processor may be initialized or refreshed so that it can process additional inputs.

Figure 6:
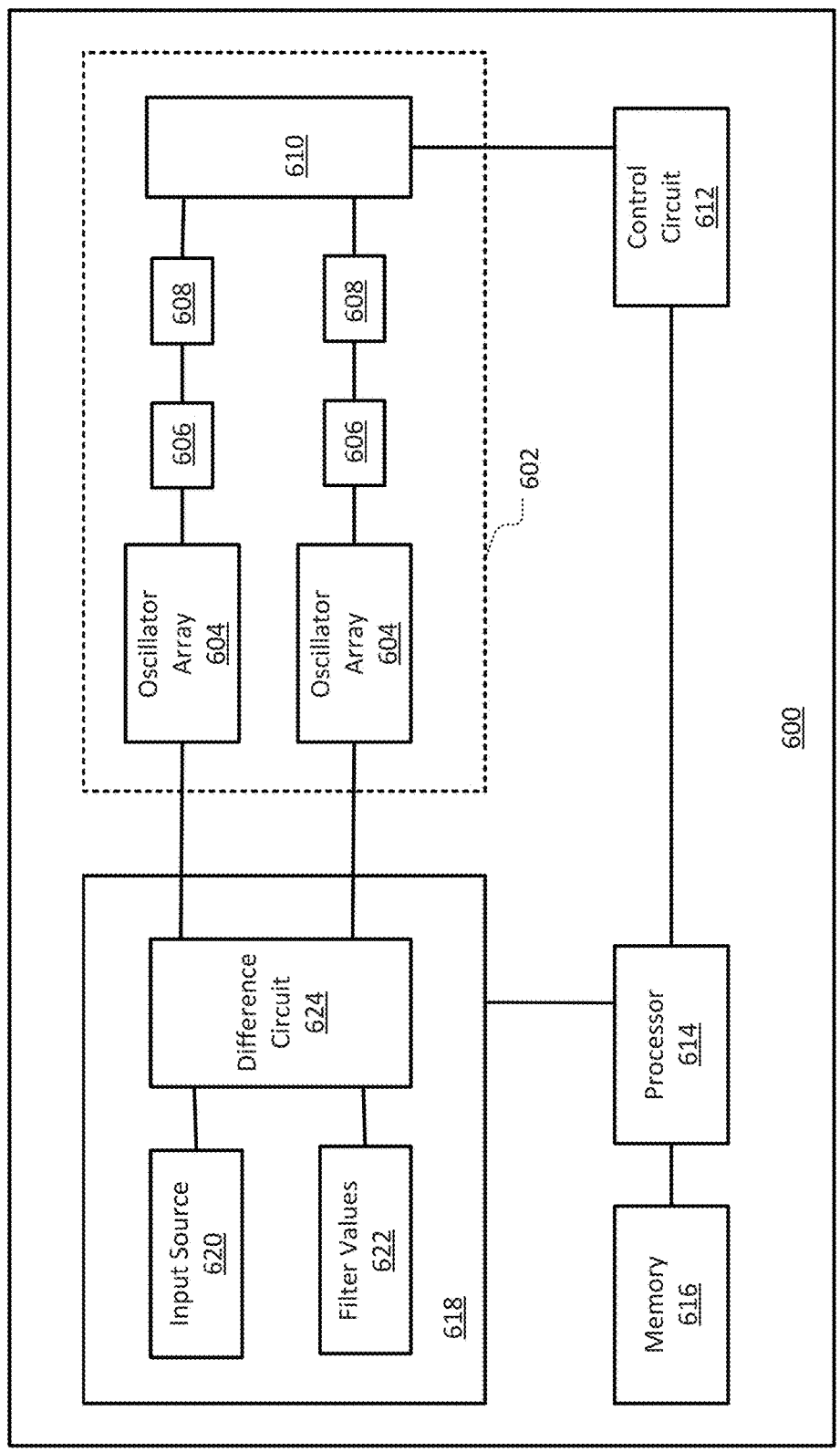
FIG. 6 schematically illustrates a computing device that may employ the associative processor of FIG. 1, in accordance with various embodiments.

FIG. 6 schematically illustrates a computing device 600 that may include an associative processor circuit (e.g., an associative processor circuit including all or portions of the associative processor 100 of FIG. 1, the coupled ring oscillator circuit 200 of FIG. 2, the inverter 300 of FIG. 3, the peak detector 400 of FIG. 4, and/or the winner-take-all circuit 500 of FIG. 5) as described herein, in accordance with various embodiments.

The computing device 600 may include an associative processor 602 that may include a plurality of oscillator arrays 604, a plurality of averagers 606, a plurality of peak detectors 608, and a winner-take-all circuit 610. The associative processor 602 may be configured as described with respect to the associative processor 100 in some embodiments. An associative processor control circuit 612 may be coupled with the associative processor 602 to receive digital binary winner flags from the winner-take-all circuit 610, such as from the inverters 508 as described with respect to FIG. 5. The associative processor control circuit 612 may correspond to all or a portion of the readout circuit mentioned with respect to FIG. 5 in some embodiments. The associative processor control circuit 612 may further be configured to initialize and/or refresh the associative processor 602 so that it can process additional inputs after the binary winner flags are read. A processor 614 that may be a digital microprocessor in some embodiments may be coupled with the associative processor control circuit 612, a memory 616, and an associative processor input circuit 618.

In some embodiments, the associative processor input circuit 618 may include an input source 620 and a filter value source 622 coupled with a difference circuit 624. The input source 620 may include in image sensor such as a charge coupled device (CCD) and associated circuitry in some embodiments. The input source 620 may provide a first set of values, such as voltages corresponding to pixels in an image fragment in some embodiments. The filter value source 622 may provide a second set of values, such as voltages corresponding to values in a Gabor filter or other template. The difference circuit 624 may determine a difference between the first set of values from the input source 620 and the second set of values from the filter value source 622, in various embodiments. The difference circuit 624 may then provide outputs corresponding to the difference between the first set of values and the second set of values to the oscillator arrays 604, such as by providing the difference as a supply voltage to the first variable supply voltage input terminal 306 as described with respect to FIG. 3. In some embodiments, the difference circuit 624 may not be present, and the first set of values may be provided to the first variable supply input terminal 306 with the second set of values provided to the second input terminal 308. In other embodiments, the input source 620 may store the first set of values as digital values, and the filter value source may store the second set of values as digital values. A digital to analog converter (DAC) (not shown) may convert the digital values from the input source 620 and the filter value source to analog values that are provided to the oscillator arrays 604.

Figure 7:
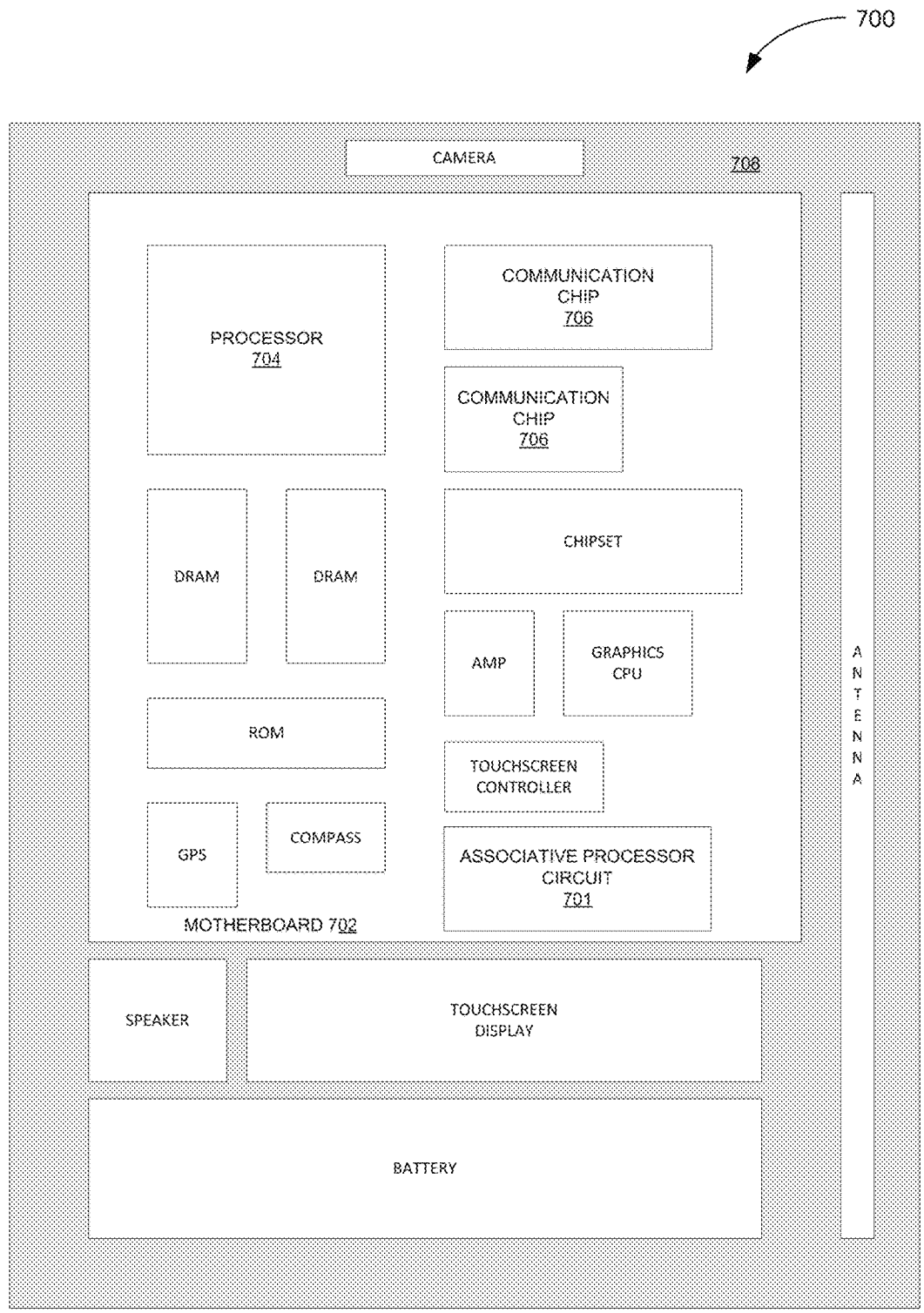
FIG. 7 schematically illustrates a system that may employ the devices and/or circuits described herein, in accordance with various embodiments.

FIG. 7 schematically illustrates an example system (e.g., computing device 700) that may include an associative processor circuit 701 (e.g., an associative processor circuit including all or portions of the associative processor 100 of FIG. 1, the coupled ring oscillator circuit 200 of FIG. 2, the inverter 300 of FIG. 3, the peak detector 400 of FIG. 4, and/or the winner-take-all circuit 500 of FIG. 5) as described herein, in accordance with various embodiments. In some embodiments, the system may include all or part of the computing device 600 described with respect to FIG. 6. Components of the computing device 700 may be housed in an enclosure (e.g., housing 708). A motherboard 702 may include a number of components, including but not limited to a processor 704 and at least one communication chip 706. The processor 704 may be physically and electrically coupled to the motherboard 702. In some implementations, the at least one communication chip 706 may also be physically and electrically coupled to the motherboard 702. In further implementations, the communication chip 706 may be part of the processor 704.

Depending on its applications, computing device 700 may include other components that may or may not be physically and electrically coupled to the motherboard 702. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In some embodiments, the associative processor circuit 701 may be integrated with one or more of the other components (e.g., processor 704, communication chip 706, ROM, and/or DRAM) of the computing device 700 such as in a system on a chip (SoC) or an ASIC.

The communication chip 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, EV-DO, and others.

In various implementations, the computing device 700 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are presented below.

Example 1 may include an electronic associative processor circuit comprising: a first ring oscillator having an odd number of inverters, an input terminal, and an output terminal; a second ring oscillator having an odd number of inverters, an input terminal, and an output terminal; a first capacitor having a first terminal and a second terminal, the first terminal of the first capacitor coupled with the output terminal of the first ring oscillator; and a second capacitor having a first terminal coupled with the output terminal of the second ring oscillator and a second terminal coupled with the second terminal of the first capacitor at an oscillator stage output terminal, wherein the inverters of the first and second ring oscillators are implemented with metal oxide semiconductor (MOS) transistors.

Example 2 may include the subject matter of Example 1, wherein at least one inverter in the first ring oscillator includes a first supply voltage input terminal to receive a first variable supply voltage, and at least one inverter in the second ring oscillator include a first supply voltage input terminal to receive a second variable supply voltage.

Example 3 may include the subject matter of Example 2, wherein the at least one inverter in the first ring oscillator includes a second supply voltage input terminal to receive a third variable supply voltage and the at least one inverter in the second ring oscillator includes a second supply voltage input terminal to receive a fourth variable supply voltage.

Example 4 may include the subject matter of any one of Examples 1-3, further comprising a peak detector having an input terminal and an output terminal, wherein the input terminal of the peak detector is coupled with the oscillator stage output terminal and wherein the peak detector is implemented with MOS transistors.

Example 5 may include the subject matter of Example 4, further comprising a winner-take-all circuit having an input terminal coupled with the output terminal of the peak detector, wherein the winner-take-all circuit is implemented with MOS transistors.

Example 6 may include the subject matter of any one of Examples 4-5, wherein the peak detector includes a high pass filter that includes an output terminal and a first MOS transistor having a source and a drain that are both coupled with the oscillator stage output terminal.

Example 7 may include the subject matter of Example 6, wherein the peak detector includes a rectifier that includes a second MOS transistor having a gate coupled with a drain of the second MOS transistor and the output terminal of the high pass filter.

Example 8 may include the subject matter of Example 7, further comprising a low-pass filter implemented with MOS transistors, wherein an input terminal of the low-pass filter is coupled with a source of the second MOS transistor.

Example 9 may include an electronic associative processor circuit comprising: a plurality of oscillator stages, each oscillator stage in the plurality of oscillator stages including a plurality of ring oscillators and a coupling circuit coupled with each of the plurality of ring oscillators and an oscillator stage output terminal; a plurality of peak detectors, each peak detector in the plurality of peak detectors coupled with an oscillator stage output terminal of an oscillator stage in the plurality of oscillator stages; and a k-winner-take-all stage coupled with the plurality of peak detectors, wherein the oscillator stages, peak detectors, and k-winner-take-all stage are implemented with metal oxide semiconductor (MOS) transistors.

Example 10 may include the subject matter of Example 9, wherein the coupling circuit includes a coupling capacitor for each ring oscillator in the plurality of ring oscillators, wherein a first terminal of each coupling capacitor is coupled with an output terminal of each ring oscillator and a second terminal of each coupling capacitor is coupled with the oscillator stage output terminal.

Example 11 may include the subject matter of any one of Examples 9-10, wherein each peak detector includes a high pass filter, a rectifier, and a low pass filter.

Example 12 may include the subject matter of Example 11, wherein: the high pass filter includes a first MOS transistor having a source and a drain that are both coupled with an oscillator stage output terminal of one of the plurality of oscillator stages.

Example 13 may include the subject matter of any one of Examples 11-12, wherein: the rectifier includes a second MOS transistor having a gate coupled with a drain of the second MOS transistor and an output terminal of the high pass filter.

Example 14 may include the subject matter of any one of Examples 9-13, wherein: each ring oscillator includes an odd number of inverters; and at least one inverter in each ring oscillator includes a first supply voltage input terminal to receive a first variable supply voltage for each ring oscillator.

Example 15 may include the subject matter of Example 14, wherein the at least one inverter in each ring oscillator includes a second supply voltage input terminal to receive a second variable supply voltage for each ring oscillator.

Example 16 may include the subject matter of any one of Examples 9-15, wherein the k-winner-take-all stage includes: an inverter stage having a plurality of inverters with each inverter having an input terminal to receive an output from one of the peak detectors in the plurality of peak detectors; and a NAND stage having a plurality of input terminals, wherein each NAND stage input terminal is to receive an output from one of the inverters in the inverter stage.

Example 17 may include a system comprising: a memory; a processor coupled with the memory; and an electronic associative processor circuit coupled with the processor, the electronic associative processor circuit including: a plurality of oscillator stages, each oscillator stage in the plurality of oscillator stages including a plurality of ring oscillators and a coupling circuit coupled with each of the plurality of ring oscillators and an oscillator stage output terminal; a plurality of peak detectors, each peak detector in the plurality of peak detectors coupled with an oscillator stage output terminal of an oscillator stage in the plurality of oscillator stages; and a winner-take-all stage coupled with the plurality of peak detectors, wherein the oscillator stages, peak detectors, and winner-take-all stage are implemented with metal oxide semiconductor (MOS) transistors.

Example 18 may include the subject matter of Example 17, wherein the coupling circuit includes a coupling capacitor for each ring oscillator in the plurality of ring oscillators, wherein a first terminal of each coupling capacitor is coupled with an output terminal of each ring oscillator and a second terminal of each coupling capacitor is coupled with the oscillator stage output terminal.

Example 19 may include the subject matter of any one of Examples 17-18, wherein each ring oscillator includes an odd number of inverters; and at least one inverter in each ring oscillator includes a first supply voltage input terminal to receive a first variable supply voltage and a second supply voltage input terminal to receive a second variable supply voltage for each ring oscillator.

Example 20 may include the subject matter of any one of Examples 17-19, wherein the electronic associative processor circuit is indirectly coupled with the processor through an associative processor control circuit that is coupled with both the processor and the electronic associative processor circuit.

Example 21 may include an electronic associative processor comprising: means for generating a first plurality of oscillating signals, wherein each oscillating signal in the first plurality of oscillating signals is based at least in part on a difference between a voltage corresponding to an image fragment at a pixel and a voltage corresponding to a value of a first filter at the pixel; means for generating a second plurality of oscillating signals, wherein each oscillating signal in the second plurality of oscillating signals is based at least in part on a difference between a voltage corresponding to an image fragment at a pixel and a voltage corresponding to a value of a second filter at the pixel; means for coupling each of the first plurality of oscillating signals to generate a first oscillator stage output signal; means for coupling each of the second plurality of oscillating signals to generate a second oscillator stage output signal; means for generating a first degree of match signal based at least in part on the first oscillator stage output signal; and means for generating a second degree of match signal based at least in part on the second oscillator stage output signal, wherein the means for generating the first plurality of oscillating signals, the means for generating the second plurality of oscillating signals, the means for coupling each of the first plurality of oscillating signals, the means for coupling each of the second plurality of oscillating signals, the means for generating the first degree of match signal, and the means for generating the second degree of match signal are implemented with metal oxide semiconductor (MOS) transistors.

Example 22 may include the subject matter of Example 21, wherein: the means for coupling each of the first plurality of oscillating signals includes means for capacitively coupling the first plurality of oscillating signals; and the means for coupling each of the second plurality of oscillating signals includes means for capacitively coupling the second plurality of oscillating signals.

Example 23 may include the subject matter of any one of Examples 21-22, wherein: the means for generating the first degree of match signal includes means for high pass filtering the first oscillator stage output signal based at least in part on a predefined high pass cutoff frequency to generate a first high pass filtered signal; and the means for generating the second degree of match signal includes means for high pass filtering the second oscillator stage output signal based at least in part on the predefined high pass cutoff frequency to generate a second high pass filtered signal.

Example 24 may include the subject matter of any one of Examples 21-23, further comprising means for determining whether at least one of the first degree of match signal or the second degree of match signal is above a predefined threshold value, wherein the means for determining whether at least one of the first degree of match signal or the second degree of match signal is above a predefined threshold value is implemented with MOS transistors.

Example 25 may include the subject matter of Example 24, further comprising means for holding a degree of match signal determined to be above the predefined threshold value, wherein the means for holding the degree of match signal is implemented with MOS transistors.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. An electronic associative processor circuit comprising:
    a first ring oscillator having an odd number of inverters, an input terminal, and an output terminal;
    a second ring oscillator having an odd number of inverters, an input terminal, and an output terminal;
    a first capacitor having a first terminal and a second terminal, the first terminal of the first capacitor coupled with the output terminal of the first ring oscillator;
    a second capacitor having a first terminal coupled with the output terminal of the second ring oscillator and a second terminal coupled with the second terminal of the first capacitor at an oscillator stage output terminal; and
    a peak detector having an input terminal and an output terminal, wherein the input terminal of the peak detector is coupled with the oscillator stage output terminal and wherein the peak detector is implemented with metal-oxide-semiconductor (MOS) transistors,
    wherein the inverters of the first and second ring oscillators are implemented with MOS transistors.

2. The electronic associative processor circuit of claim 1, wherein at least one inverter in the first ring oscillator includes a first supply voltage input terminal to receive a first variable supply voltage, and at least one inverter in the second ring oscillator includes a first supply voltage input terminal to receive a second variable supply voltage.

3. The electronic associative processor circuit of claim 2, wherein the at least one inverter in the first ring oscillator includes a second supply voltage input terminal to receive a third variable supply voltage and the at least one inverter in the second ring oscillator includes a second supply voltage input terminal to receive a fourth variable supply voltage.

4. The electronic associative processor circuit of claim 1, further comprising a winner-take-all circuit having an input terminal coupled with the output terminal of the peak detector, wherein the winner-take-all circuit is implemented with MOS transistors.

5. The electronic associative processor circuit of claim 1, wherein the peak detector includes a high pass filter that includes an output terminal and a first MOS transistor having a source and a drain that are both coupled with the oscillator stage output terminal.

6. The electronic associative processor circuit of claim 5, wherein the peak detector includes a rectifier that includes a second MOS transistor having a gate coupled with a drain of the second MOS transistor and the output terminal of the high pass filter.

7. The electronic associative processor circuit of claim 6, further comprising a low-pass filter implemented with MOS transistors, wherein an input terminal of the low-pass filter is coupled with a source of the second MOS transistor.

8. An electronic associative processor circuit comprising:
a plurality of oscillator stages, each oscillator stage in the plurality of oscillator stages including a plurality of ring oscillators and a coupling circuit coupled with each of the plurality of ring oscillators and an oscillator stage output terminal;
a plurality of peak detectors, each peak detector in the plurality of peak detectors coupled with an oscillator stage output terminal of an oscillator stage in the plurality of oscillator stages; and
a k-winner-take-all stage coupled with the plurality of peak detectors,
wherein the oscillator stages, peak detectors, and k-winner-take-all stage are implemented with metal oxide semiconductor (MOS) transistors.

9. The electronic associative processor circuit of claim 8, wherein the coupling circuit includes a coupling capacitor for each ring oscillator in the plurality of ring oscillators, wherein a first terminal of each coupling capacitor is coupled with an output terminal of each ring oscillator and a second terminal of each coupling capacitor is coupled with the oscillator stage output terminal.

10. The electronic associative processor circuit of claim 8, wherein each peak detector includes a high pass filter, a rectifier, and a low pass filter.

11. The electronic associative processor circuit of claim 10, wherein:
the high pass filter includes a first MOS transistor having a source and a drain that are both coupled with an oscillator stage output terminal of one of the plurality of oscillator stages.

12. The electronic associative processor circuit of claim 10, wherein:
the rectifier includes a second MOS transistor having a gate coupled with a drain of the second MOS transistor and an output terminal of the high pass filter.

13. The electronic associative processor circuit of claim 8, wherein:
each ring oscillator includes an odd number of inverters; and
at least one inverter in each ring oscillator includes a first supply voltage input terminal to receive a first variable supply voltage for each ring oscillator.

14. The electronic associative processor circuit of claim 13, wherein the at least one inverter in each ring oscillator includes a second supply voltage input terminal to receive a second variable supply voltage for each ring oscillator.

15. The electronic associative processor circuit of claim 8, wherein the k-winner-take-all stage includes:
an inverter stage having a plurality of inverters with each inverter having an input terminal to receive an output from one of the peak detectors in the plurality of peak detectors; and
a NAND stage having a plurality of input terminals, wherein each NAND stage input terminal is to receive an output from one of the inverters in the inverter stage.

16. A system comprising:
a memory;
a processor coupled with the memory; and
an electronic associative processor circuit coupled with the processor, the electronic associative processor circuit including:
a plurality of oscillator stages, each oscillator stage in the plurality of oscillator stages including a plurality of ring oscillators and a coupling circuit coupled with each of the plurality of ring oscillators and an oscillator stage output terminal;
a plurality of peak detectors, each peak detector in the plurality of peak detectors coupled with an oscillator stage output terminal of an oscillator stage in the plurality of oscillator stages; and
a winner-take-all stage coupled with the plurality of peak detectors,
wherein the oscillator stages, peak detectors, and winner-take-all stage are implemented with metal oxide semiconductor (MOS) transistors.

17. The system of claim 16, wherein the coupling circuit includes a coupling capacitor for each ring oscillator in the plurality of ring oscillators, wherein a first terminal of each coupling capacitor is coupled with an output terminal of each ring oscillator and a second terminal of each coupling capacitor is coupled with the oscillator stage output terminal.

18. The system of claim 16, wherein each ring oscillator includes an odd number of inverters; and
at least one inverter in each ring oscillator includes a first supply voltage input terminal to receive a first variable supply voltage and a second supply voltage input terminal to receive a second variable supply voltage for each ring oscillator.

19. The system of claim 16, wherein the electronic associative processor circuit is indirectly coupled with the processor through an associative processor control circuit that is coupled with both the processor and the electronic associative processor circuit.

20. An electronic associative processor comprising:
means for generating a first plurality of oscillating signals, wherein each oscillating signal in the first plurality of oscillating signals is based at least in part on a difference between a voltage corresponding to an image fragment at a pixel and a voltage corresponding to a value of a first filter at the pixel;
means for generating a second plurality of oscillating signals, wherein each oscillating signal in the second plurality of oscillating signals is based at least in part on a difference between a voltage corresponding to an image fragment at a pixel and a voltage corresponding to a value of a second filter at the pixel;
means for coupling each of the first plurality of oscillating signals to generate a first oscillator stage output signal;

means for coupling each of the second plurality of oscillating signals to generate a second oscillator stage output signal;

means for generating a first degree of match signal based at least in part on the first oscillator stage output signal; and means for generating a second degree of match signal based at least in part on the second oscillator stage output signal, wherein the means for generating the first plurality of oscillating signals, the means for generating the second plurality of oscillating signals, the means for coupling each of the first plurality of oscillating signals, the means for coupling each of the second plurality of oscillating signals, the means for generating the first degree of match signal, and the means for generating the second degree of match signal are implemented with metal oxide semiconductor (MOS) transistors.

21. The electronic associative processor of claim 20, wherein:

the means for coupling each of the first plurality of oscillating signals includes means for capacitively coupling the first plurality of oscillating signals; and the means for coupling each of the second plurality of oscillating signals includes means for capacitively coupling the second plurality of oscillating signals.

22. The electronic associative processor of claim 20, wherein:

the means for generating the first degree of match signal includes means for high pass filtering the first oscillator stage output signal based at least in part on a predefined high pass cutoff frequency to generate a first high pass filtered signal; and the means for generating the second degree of match signal includes means for high pass filtering the second oscillator stage output signal based at least in part on the predefined high pass cutoff frequency to generate a second high pass filtered signal.

23. The electronic associative processor of claim 20, further comprising means for determining whether at least one of the first degree of match signal or the second degree of match signal is above a predefined threshold value, wherein the means for determining whether at least one of the first degree of match signal or the second degree of match signal is above a predefined threshold value is implemented with MOS transistors.

24. The electronic associative processor of claim 23, further comprising means for holding a degree of match signal determined to be above the predefined threshold value, wherein the means for holding the degree of match signal is implemented with MOS transistors.

25. An electronic associative processor circuit comprising:

a first ring oscillator having an odd number of inverters, an input terminal, and an output terminal;

a second ring oscillator having an odd number of inverters, an input terminal, and an output terminal;

a first capacitor having a first terminal and a second terminal, the first terminal of the first capacitor coupled with the output terminal of the first ring oscillator; and a second capacitor having a first terminal coupled with the output terminal of the second ring oscillator and a second terminal coupled with the second terminal of the first capacitor at an oscillator stage output terminal;

wherein at least one inverter in the first ring oscillator includes a first supply voltage input terminal to receive a first variable supply voltage, and a second supply voltage input terminal to receive a second variable supply voltage; and wherein at least one inverter in the second ring oscillator include a first supply voltage input terminal to receive a third variable supply voltage, and a second supply voltage input terminal to receive a fourth variable supply voltage.

* * * * *